(12) United States Patent
Ahn et al.

(10) Patent No.: US 11,978,728 B2
(45) Date of Patent: May 7, 2024

(54) DISPLAY DEVICE

(71) Applicant: SAMSUNG ELECTRONICS CO., LTD., Suwon-si (KR)

(72) Inventors: Hoyoung Ahn, Suwon-si (KR); Junhee Choi, Seongnam-si (KR); Kyungwook Hwang, Hwaseong-si (KR); Jinjoo Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/883,160

(22) Filed: Aug. 8, 2022

(65) Prior Publication Data
US 2022/0384676 A1 Dec. 1, 2022

Related U.S. Application Data

(63) Continuation of application No. 16/593,635, filed on Oct. 4, 2019, now Pat. No. 11,450,650.

(30) Foreign Application Priority Data

Dec. 3, 2018 (KR) .......................... 10-2018-0153721

(51) Int. Cl.
*H01L 25/13* (2006.01)
*H01L 33/10* (2010.01)
*H01L 33/22* (2010.01)
*H01L 33/38* (2010.01)
*H01L 33/50* (2010.01)

(52) U.S. Cl.
CPC .............. *H01L 25/13* (2013.01); *H01L 33/10* (2013.01); *H01L 33/22* (2013.01); *H01L 33/38* (2013.01); *H01L 33/382* (2013.01); *H01L 33/505* (2013.01)

(58) Field of Classification Search
CPC ..... H01L 33/58; H01L 33/60; H01L 51/5271; H01L 51/5281
See application file for complete search history.

(56) References Cited

U.S. PATENT DOCUMENTS

| 11,450,650 | B2* | 9/2022 | Ahn ........................ H01L 33/10 |
| 2009/0079336 | A1* | 3/2009 | Yamada ............... H10K 50/852 |
| | | | 313/504 |
| 2011/0263054 | A1* | 10/2011 | Yu ........................ H01L 33/145 |
| | | | 438/34 |
| 2011/0275173 | A1 | 11/2011 | Khaja et al. |

(Continued)

FOREIGN PATENT DOCUMENTS

| KR | 10-2016-0029491 A | 3/2016 |
| KR | 10-2017-0084139 A | 7/2017 |

OTHER PUBLICATIONS

Communication dated Dec. 28, 2023, issued by Korean Intellectual Property Office in Korean Patent Application No. 10-2018-0153721.

*Primary Examiner* — Raj R Gupta
(74) *Attorney, Agent, or Firm* — Sughrue Mion, PLLC

(57) ABSTRACT

A display device includes a substrate, an emission layer provided on the substrate and a reflective layer provided on the emission layer. The emission layer has an emission region that emits light, the reflective layer has a first opening, the emission region overlaps the first opening in a direction perpendicular to an upper surface of the substrate and a first width of the emission region is smaller than a second width of the first opening.

20 Claims, 12 Drawing Sheets

(56) References Cited

U.S. PATENT DOCUMENTS

| | | | |
|---|---|---|---|
| 2012/0299472 A1* | 11/2012 | Chung | ................ H10K 50/856 |
| | | | 313/504 |
| 2015/0053918 A1 | 2/2015 | Chen et al. | |
| 2017/0346039 A1* | 11/2017 | Kato | .................... H10K 50/844 |
| 2018/0047867 A1 | 2/2018 | Schuele et al. | |
| 2020/0028036 A1 | 1/2020 | Bonar et al. | |
| 2020/0075665 A1 | 3/2020 | Park et al. | |
| 2020/0091226 A1 | 3/2020 | Hwang et al. | |

* cited by examiner

DISPLAY DEVICE

CROSS-REFERENCE TO RELATED APPLICATION

This application is a continuation of U.S. application Ser. No. 16/593,635, filed Oct. 4, 2019, which claims priority to Korean Patent Application No. 10-2018-0153721, filed on Dec. 3, 2018, in the Korean Intellectual Property Office, the disclosure of which is incorporated herein in its entirety by reference.

BACKGROUND

1. Field

Example embodiments of the present disclosure relate to display devices and methods of manufacturing the display devices, and more particularly, to display devices having an improved light quality.

2. Description of Related Art

Liquid crystal displays (LCDs) and organic light emitting diode (OLED) displays are widely used as display devices. Recently, a technology of manufacturing a high-resolution display device using a micro-light emitting diode (LED) has attracted attention. However, to manufacture the high-resolution display device using the micro-LED, it is necessary to fabricate small size LED chips with high efficiency, and a high-level transfer technique is required to arrange the small size LED chips in proper positions.

SUMMARY

Provided are display devices having improved light efficiency, and methods of manufacturing the display devices.

Additional aspects will be set forth in part in the description which follows and, in part, will be apparent from the description, or may be learned by practice of the example embodiments.

In accordance with an aspect of the disclosure, there is provided a display device comprising: a substrate; an emission layer provided on the substrate, the emission layer comprising an emission region that emits light; and a reflective layer provided on the emission layer, the reflective layer comprising a first opening, wherein the emission region overlaps the first opening in a first direction perpendicular to an upper surface of the substrate, and wherein a first width of the emission region is smaller than a second width of the first opening.

The display device may further comprise a lower insulating layer provided between the emission layer and the reflective layer, the lower insulating layer having a second opening overlapping the first opening in the first direction, and wherein the reflective layer extends along a surface of the lower insulating layer and is provided at least in a portion of the second opening.

The second width of the first opening may be configured to emit through the first opening the light reaching an upper surface of the emission layer at a maximum transmission incidence angle, and wherein the maximum transmission incidence angle is a maximum angle at which light transmits through the emission layer.

The emission layer may further comprise an upper semiconductor layer provided between the emission region and the lower insulating layer, and wherein, in a plan view, a distance between the reflective layer and the emission region may be greater than or equal to a product of a thickness of the upper semiconductor layer and a result of a tan function of the maximum transmission incidence angle.

The first opening may expose the emission layer in a plan view, and wherein the reflective layer may be in direct contact with the emission layer.

The display device may further comprise an upper insulating layer provided on the reflective layer, wherein the upper insulating layer extends into the first opening and is in direct contact with the emission layer.

The display device may further comprise: an upper insulating layer provided on the reflective layer and having a third opening; and a color conversion pattern provided on the upper insulating layer, in the third opening and extending into the first opening.

The display device may further comprise an upper electrode layer provided between the emission layer and the reflective layer, wherein the upper electrode layer has a smaller refractive index than the emission layer, wherein the first opening exposes the upper electrode layer in a plan view, wherein the second width of the first opening is configured to emit through the first opening the light reaching an upper surface of the emission layer at a maximum transmission incidence angle, and wherein the maximum transmission incidence angle is a maximum angle at which the light transmits through the emission layer and is smaller than a threshold angle at which the light is totally reflected from an interface between the upper electrode layer and the emission layer.

The display device may further comprise light extraction patterns protruding from an upper surface of the upper electrode layer, wherein the light extraction patterns are provided in the first opening.

The emission layer may further comprise an upper semiconductor layer provided between the emission region and the upper electrode layer, and wherein, in a plan view, a distance between the reflective layer and the emission region greater than or equal to a sum of a first product and a second product, wherein the first product is a product of a thickness of the upper semiconductor layer and a result of a tan function of the maximum transmission incidence angle, and wherein the second product is a product of a thickness of the upper electrode layer) and a result of a tan function of a refractive angle when the light transmits through the emission layer at the maximum transmission incidence angle.

The display device may further comprise light extraction patterns protruding from an upper surface of the upper semiconductor layer, wherein the light extraction patterns overlap the second opening in the first direction.

The emission layer may comprise: a lower semiconductor layer; an upper semiconductor layer stacked on the lower semiconductor layer; and an active layer provided between the lower semiconductor layer and the upper semiconductor layer, and wherein the active layer may comprise: the emission region; and an ion implantation region surrounding the emission region, when viewed in a plan view.

In accordance with another aspect of the disclosure, there is provided a display device comprising: a substrate; an emission layer provided on the substrate; and an upper electrode layer provided on the emission layer, the upper electrode layer comprising a recess region, wherein the emission layer comprises an emission region that overlaps the recess region in a first direction perpendicular to an upper surface of the substrate and emits light, and wherein a first width of the emission region is smaller than a second width of the recess region.

The second width of the recess region may be configured to emit through the recess region the light reaching an upper surface of the emission layer at a maximum transmission incidence angle, wherein the maximum transmission incidence angle is a maximum angle at which the light transmits through the emission layer and is smaller than a threshold angle at which the light is totally reflected from an interface between the upper electrode layer and the emission layer.

The display device may further comprise light extraction patterns protruding from an upper surface of the upper electrode layer, wherein the light extraction patterns are provided in the recess region.

The display device may further comprise a lower insulating layer provided between the emission layer and the upper electrode layer, the lower insulating layer comprising an opening overlapping the recess region in the first direction, wherein the upper electrode layer extends along a surface of the lower insulating layer and is provided in at least a portion of the opening.

The display device may further comprise light extraction patterns protruding from an upper surface of the emission layer, wherein the light extraction patterns overlap the recess region in the first direction perpendicular to the upper surface of the substrate.

In accordance with an aspect of the disclosure, there is provided a display device comprising: a substrate; an emission layer provided on the substrate, the emission layer comprising a plurality of emission regions that emit light; a color conversion layer provided on the emission layer; and a reflective layer provided between the emission layer and the color conversion layer, the reflective layer comprising a plurality of openings, wherein the plurality of emission regions respectively overlap the plurality of openings in a first direction perpendicular to an upper surface of the substrate, and wherein a first width of each of the plurality of emission regions is smaller than a second width of each of the plurality of openings.

The color conversion layer may comprise a plurality of color conversion patterns, and wherein the plurality of color conversion patterns face the plurality of emission regions, respectively.

The plurality of emission regions may be spaced from each other in a second direction parallel to the upper surface of the substrate.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
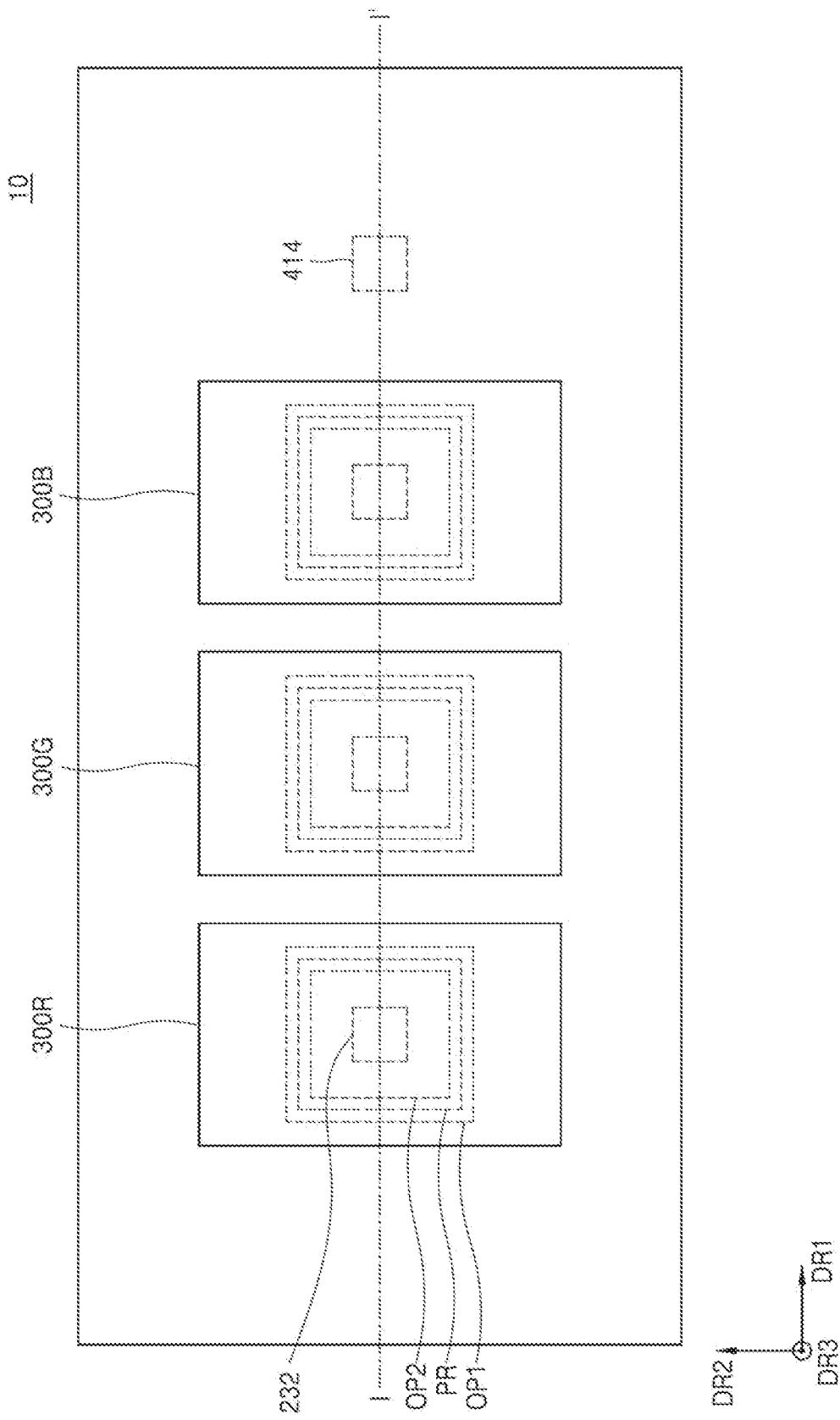
FIG. 1 is a plan view of a display device according to an example embodiment.

Reference will now be made in detail to certain example embodiments, examples of which are illustrated in the accompanying drawings. In the drawings, like reference numerals refer to like elements throughout and sizes of constituent elements may be exaggerated for convenience of explanation and the clarity of the specification. In this regard, the example embodiments may have different forms and should not be construed as being limited to the descriptions set forth herein. Expressions such as "at least one of," when preceding a list of elements, modify the entire list of elements and do not modify the individual elements of the list.

It will also be understood that when an element is referred to as being "on" or "above" another element, the element may be in direct contact with the other element or other intervening elements may be present.

In the following example embodiments, the singular forms include the plural forms unless the context clearly indicates otherwise. It should be understood that, when a part "comprises" or "includes" an element in the specification, unless otherwise defined, other elements are not excluded from the part and the part may further include other elements.

Also, in the specification, the term "units" or " . . . modules" denote units or modules that process at least one function or operation, and may be realized by hardware, software, or a combination of hardware and software.

Figure 2:
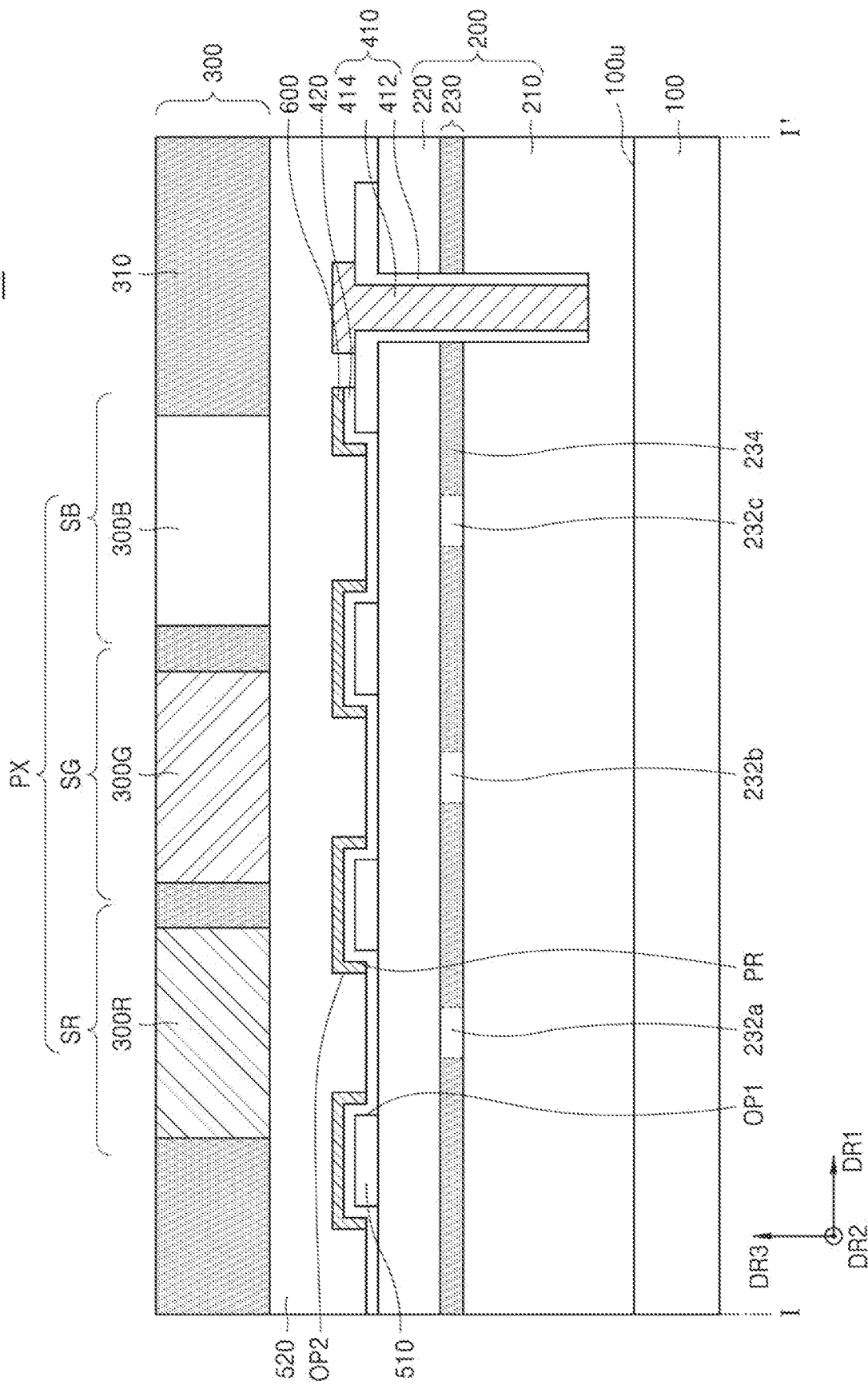
FIG. 2 is a cross-sectional view taken along a line I-I' in FIG. 1 according to an example embodiment.
Figure 3:
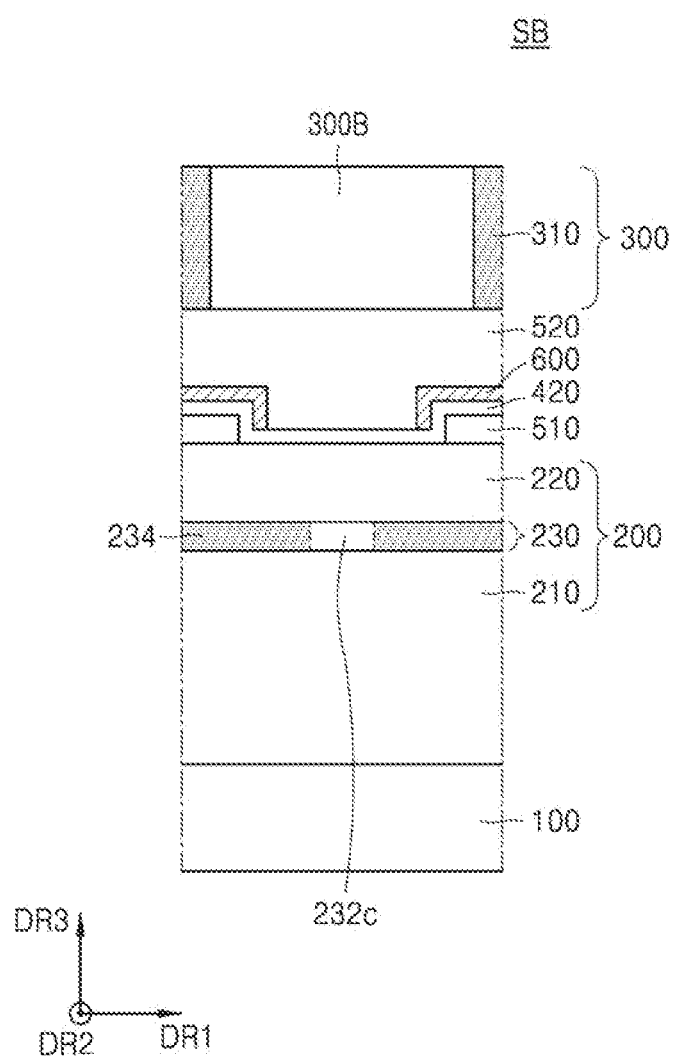
FIG. 3 is a cross-sectional view of a sub-pixel of FIG. 2 according to an example embodiment.
Figure 4:
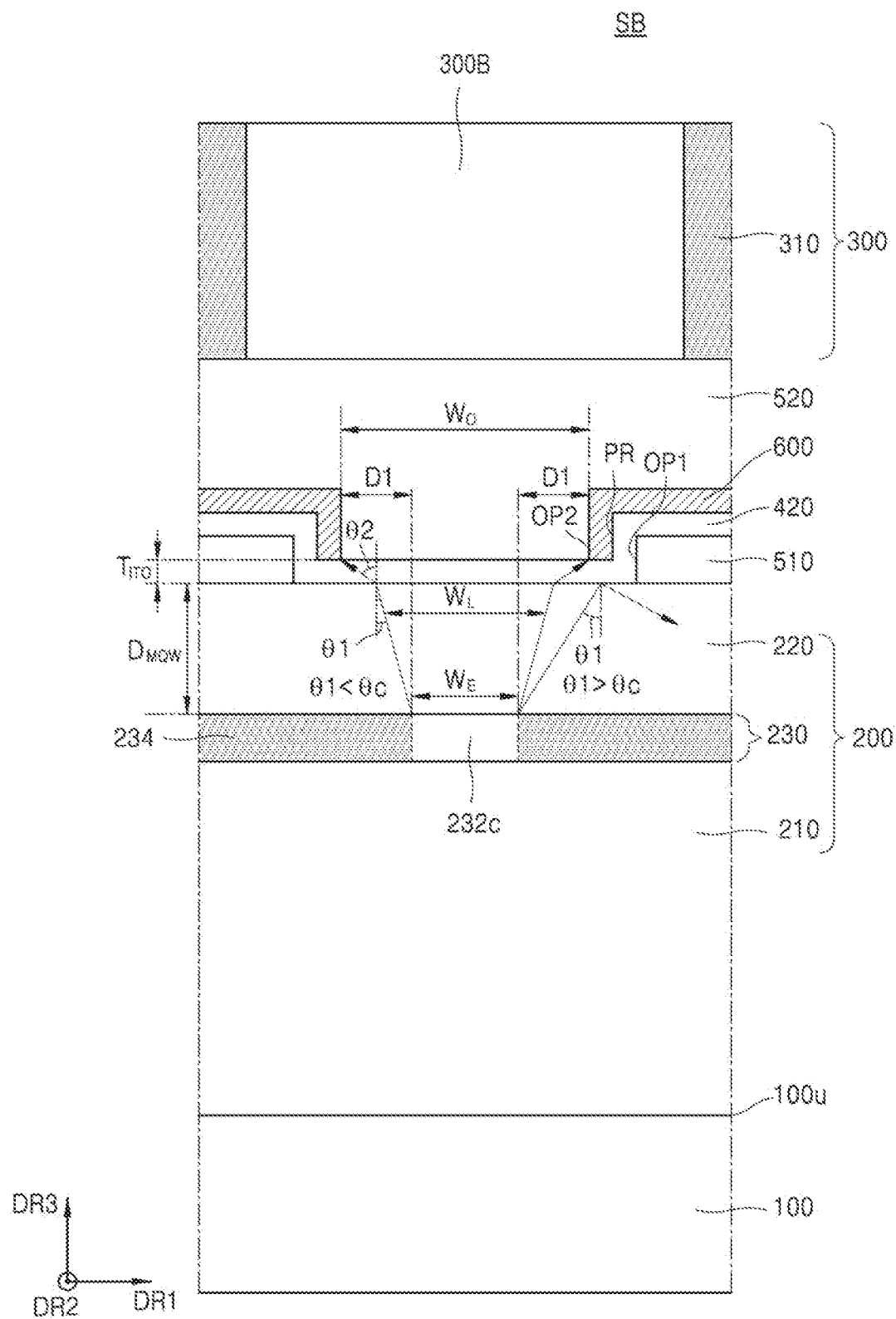
FIG. 4 is a cross-sectional view of the sub-pixel of FIG. 2 to explain widths of a second opening and an emission region according to an example embodiment.

FIG. 1 is a plan view of a display device 10 according to an example embodiment. FIG. 2 is a cross-sectional view taken along a line I-I' in FIG. 1. FIG. 3 is a cross-sectional view of a sub-pixel of FIG. 2. FIG. 4 is a cross-sectional view of the sub-pixel of FIG. 2 to explain widths of a second opening and an emission region.

Referring to FIGS. 1 to 3, the display device 10 including a substrate 100, an emission layer 200, and a color conversion layer 300 may be provided. The display device 10 may include a pixel PX. The pixel PX may include a first sub-pixel SR, a second sub-pixel SG, and a third sub-pixel SB. For example, the first through third sub-pixels SR, SG, and SB may emit red light, green light, and blue light, respectively. One pixel PX is shown but is not limited thereto. In other example embodiments, the display device 10 may include a plurality of pixels. Although FIGS. 3 and 4 show only a cross-sectional view illustrating a structure of a sub-pixel SB of FIG. 2, the structures of sub-pixels SG and SR may be similar in nature to the sub-pixel SB.

The substrate 100 may be provided to grow the emission layer 200. For example, the substrate 100 may include a glass substrate, a silicon substrate, a sapphire substrate, or a combination thereof.

The emission layer 200 may be provided on the substrate 100. The emission layer 200 may include an inorganic light emitting diode (LED) layer. For example, the emission layer 200 may emit blue light, but is not limited thereto. A wavelength of light emitted from the emission layer 200 may be determined according to a material in the emission layer 200. The emission layer 200 may include a lower semiconductor layer 210, an upper semiconductor layer 220, and an active layer 230.

The lower semiconductor layer 210 may be provided on the substrate 100. The lower semiconductor layer 210 may include a III-V compound semiconductor. The lower semiconductor layer 210 may be of a first conductivity type. For example, the lower semiconductor layer 210 may include n-type GaN. The lower semiconductor layer 210 may have a single-layer structure or a multi-layer structure.

The upper semiconductor layer 220 may be provided on the lower semiconductor layer 210. The upper semiconductor layer 220 may include a III-V compound semiconductor. The upper semiconductor layer 220 may be of a second conductivity type opposite to the first conductivity type. For example, the upper semiconductor layer 220 may include p-type GaN. The upper semiconductor layer 220 may have a single-layer structure or a multi-layer structure.

The active layer 230 may be provided between the lower semiconductor layer 210 and the upper semiconductor layer 220. The active layer 230 may receive electrons and holes provided from the lower and upper semiconductor layers 210 and 220 to generate light. The active layer 230 may include a single quantum well (SQW), a multi quantum well (MQW), superlattices (SLs), or a combination thereof. For example, the active layer 230 may include $In_xGa_{1-x}N/GaN$ ($0 \leq x < 1$).

The active layer 230 may include first to third emission regions 232a, 232b, and 232c and an ion implantation region 234. The first to third emission regions 232a, 232b and 232c may receive electrons and holes to generate light. The ion implantation region 234 may not produce light. When viewed in a plan view, the ion implantation region 234 may surround each of the first to third emission regions 232a, 232b, and 232c. The ion implantation region 234 may be generated by an ion implantation process. For example, the ion implantation process using a mask pattern may be performed on a multiple quantum well layer formed on the lower semiconductor layer 210 to form the ion implantation region 234 in a part of the multiple quantum well layer. For example, nitrogen or boron ions may be provided to the ion implantation region 234 by the ion implantation process. The ions may be implanted at a dose of about $10^{12}$ and about $10^{20}$ ions/cm². The ion implantation region 234 may have insulating properties. Other parts of the multiple quantum well layer may be defined as the first to third emission regions 232a, 232b, and 232c. The first to third emission regions 232a, 232b and 232c will be described later.

The color conversion layer 300 may be provided on the emission layer 200. The color conversion layer 300 may be converted into a specific color by receiving the light emitted from the emission layer 200. The color conversion layer 300 may include first to third color conversion patterns 300R, 300G, and 300B and a barrier rib 310. The first through third color conversion patterns 300R, 300G, and 300B may be provided in the first through third sub-pixels SR, SG, and SB, respectively. The first to third color conversion patterns 300R, 300G, and 300B may correspond to the first to third emission regions 232a, 232b, and 232c, respectively.

For example, the first light conversion pattern 300R may emit red light by receiving light emitted from the first emission region 232a in the first sub-pixel SR. When the first emission region 232a emits blue light, the first light conversion pattern 300R may include quantum dots (QDs) or phosphors that are excited by the blue light to emit red light.

A QD may have a core-shell structure having a core portion and a shell portion, and may also have a shell-free particle structure. The core-shell structure may have a single-shell or a multi-shell. For example, the multi-shell may be a double-shell. In certain example embodiments, the QD may include at least one of a II-VI compound semiconductor, a III-V compound semiconductor, a IV-VI compound semiconductor, a Group IV semiconductor, and a graphene QD. For example, the QD may include at least one of Cd, Se, Zn, S and InP, but is not limited thereto. A diameter of the QD may be several tens of nm or less. For example, the diameter of the QD may be about 10 nm or less. In certain example embodiments, the first light conversion pattern 300R may further include a photoresist and a light scattering agent.

The second light conversion pattern 300G may emit green light by receiving light emitted from the second emission pattern 232b in the second sub-pixel SG. When the second emission pattern 232b emits blue light, the second light conversion pattern 300G may include QDs or phosphors that are excited by the blue light to emit green light. In example embodiments, the second light conversion pattern 300G may further include a photoresist and a light scattering agent.

The third light conversion pattern 300B may receive light emitted from the third emission pattern 232c in the third sub-pixel SB to emit light of the same color. When the third emission pattern 232c emits blue light, the third light conversion pattern 300B may include a transmission pattern that transmits the light emitted from the third emission pattern 232c without converting a wavelength of the light. When the third light conversion pattern 300B is the transmission pattern, the third light conversion pattern 300B may not include a QD. In example embodiments, the third light conversion pattern 300B may include a photoresist and a light scattering agent.

The barrier rib 310 may surround each of the first to third light conversion patterns 300R, 300G, and 300B. The barrier rib 310 may absorb light to prevent crosstalk from occurring between the first, second, and third sub-pixels SR, SG, and SB. The first to third light conversion patterns 300R, 300G, and 300B that are immediately adjacent to each other may be spaced apart from each other by the barrier rib 310. For example, the barrier rib 310 may include at least one of a black matrix material, a resin, and a polymer.

A lower electrode pattern 410, which contacts the lower semiconductor layer 210 through the upper semiconductor layer 220 and the active layer 230, may be provided. The lower electrode pattern 410 may include an insulating pattern 412 and a contact 414. The insulating pattern 412 may electrically insulate the contact 414 from the upper semiconductor layer 220 and the active layer 230. For example, the insulating pattern 412 may include $SiO_2$, $Al_2O_3$, SiN, or a combination thereof. The contact 414 may be electrically connected to the lower semiconductor layer 210.

A lower insulating layer 510 may be provided on the upper semiconductor layer 220. The lower insulating layer 510 may insulate the upper semiconductor layer 220 and prevent the light emitted from the first, second, and third emission regions 232a, 232b and 232c in one pixel from being emitted through adjacent pixels. The lower insulating layer 510 may include an insulating material having a refractive index that is less than that of the upper semiconductor layer 220. For example, the lower insulating layer 510 may include $SiO_2$, $Al_2O_3$, SiN, or a combination thereof. The lower insulating layer 510 may include a first opening OP1. The first opening OP1 may expose the upper semiconductor layer 220. The first opening OP1 may have a first size.

An upper electrode layer 420 may be provided on the lower insulating layer 510. The upper electrode layer 420 may extend along an upper surface of the upper semiconductor layer 220 exposed by a surface of the lower insulating layer 510 and the first opening OP1. That is, a part of the upper electrode layer 420 may be provided in the first opening OP1. The upper electrode layer 420 may have a recess region PR overlapping the first opening OP1. The recess region PR may be defined as a region between the uppermost surface of the upper electrode layer 420 and the upper surface of the upper electrode layer 420 disposed in the first opening OP1. The upper electrode layer 420 may be in direct contact with the upper semiconductor layer 220. The upper electrode layer 420 may be electrically connected to the upper semiconductor layer 220. The upper electrode layer 420 may include a transparent conductive material. For example, the upper electrode layer 420 may include ITO (Indium Tin Oxide), ZnO, IZO (Indium Zinc Oxide), IGZO (Indium Gallium Zinc Oxide), Ag, Au, and combinations thereof.

A reflective layer 600 may be provided on the upper electrode layer 420. The reflective layer 600 may reflect the light emitted from the first, second, and third emission regions 232a, 232b, and 232c to reduce or prevent light leakage. The reflective layer 600 may include a metallic material having a reflective characteristic. For example, the reflective layer 600 may include molybdenum (Mo). The reflective layer 600 may be spaced apart from the lower insulating layer 510 by the upper electrode layer 420. The reflective layer 600 may overlap the lower insulating layer 510 in a second direction DR2 perpendicular to an upper surface 100u of the substrate 100. The reflective layer 600 may extend along the surface of the upper electrode layer 420.

The reflective layer 600 may include a second opening OP2 exposing the upper surface of the upper electrode layer 420. The second opening OP2 may overlap the recess region PR.

An upper insulating layer 520 may be provided between the reflective layer 600 and the color conversion layer 300. The upper insulating layer 520 may insulate the upper electrode layer 420 and the reflective layer 600 and prevent the light emitted from the first, second, and third emission regions 232a, 232b and 232c in one pixel from being emitted through adjacent pixels. The upper insulating layer 520 may include an insulating material having a refractive index that is less than that of the upper semiconductor layer 220. For example, the upper insulating layer 520 may include $SiO_2$, $Al_2O_3$, SiN, or a combination thereof.

Referring to FIG. 4, a width $W_O$ of the second opening OP2 may be greater than a width $W_E$ of the emission region 232a. The widths $W_O$ and $W_E$ may be sizes in the directions DR1 and DR2 parallel to the upper surface 100u of the substrate 100.

The light emitted from the first, second, and third emission regions 232a, 232b and 232c may be incident on an interface between the upper semiconductor layer 220 and the upper electrode layer 420 at a first angle θ1. The first angle θ1 may be referred to as an incidence angle. In this case, the first angle 61 may be an angle formed by the light and the third direction DR3 perpendicular to the upper surface 100u of the substrate 100.

The upper electrode layer 420 may have a smaller refractive index than the upper semiconductor layer 220. Accordingly, when light is incident on the interface between the upper semiconductor layer 220 and the upper electrode layer 420 at an angle greater than a threshold angle θc, the light may be totally reflected. That is, when the first angle θ1 is greater than the threshold angle θc, the light may not transmit through the upper semiconductor layer 220.

When the light is incident on the interface between the upper semiconductor layer 220 and the upper electrode layer 420 at an angle less than the threshold angle θc, the light may transmit through the upper semiconductor layer 220. A maximum incidence angle at which the light may transmit through the upper semiconductor layer 220 may be referred to as a maximum transmission incidence angle θM1.

The light transmitted through the upper semiconductor layer 220 may be refracted at a second angle θ2 and travel in the upper electrode layer 420. The second angle θ2 may be referred to as a refraction angle. The second angle θ2 of the light transmitted through the interface between the upper semiconductor layer 220 and the upper electrode layer 420 at the maximum transmission incidence angle θM1 may be referred to as a maximum transmission refraction angle θM2.

The light transmitted through the upper semiconductor layer 220 may reach the second opening OP2 through the upper electrode layer 420. The width $W_O$ of the second opening OP2 may be determined such that the light transmitted through the interface between the upper semiconductor layer 220 and the upper electrode layer 420 at the maximum transmission incidence angle θM1 may be emitted through the second opening OP. That is, the width $W_O$ of the second opening OP2 may be equal to or greater than a width $W_L$ of the light when the light transmitted through the interface between the upper semiconductor layer 220 and the upper electrode layer 420 at the maximum transmission incidence angle θM1 reaches the second opening OP2.

When viewed in a plan view, the emission region 232 may be spaced a first distance D1 from a side of the second opening OP2. The first distance D1 may be determined by the following equation.

$$D1 = (D_{MQW} \times \tan(\theta 1) + T_{ITO} \times \tan(\theta 2))$$

(DMQW: a distance between the first, second, and third emission regions 232a, 232b and 232c and the upper surface of the upper semiconductor layer 220 and $T_{ITO}$: a thickness of the upper electrode layer 420)

The first distance D1 may satisfy the following equation with the maximum transmission incidence angle θM1 and the maximum transmission refraction angle θM2.

$$D1 \geq (D_{MQW} \times \tan(\theta M1) + T_{ITO} \times \tan(\theta M2))$$

Accordingly, the light transmitted through the upper semiconductor layer 220 may be totally emitted through the second opening OP2. For example, when the upper semiconductor layer 220 is a GaN layer (a refractive index: 2.5) and the upper electrode layer 420 is an ITO layer (a refractive index: 2.0), θM1 is 35.73° and θM2 may be 46.89°. Accordingly, the first distance D1 may be $2.88D_{MQW} + 4.28T_{ITO}$. In other example embodiments, when the first distance D1 is less than $D_{MQW} \times \tan(\theta M1) + T_{ITO} \times \tan(\theta M2)$, the amount of light emitted through the second opening OP2 may be less than when the first distance D1 is equal to or greater than $D_{MQW} \times \tan(\theta M1) + T_{ITO} \times \tan(\theta M2)$.

According to certain embodiments of the disclosure, the size of the second opening OP2 and a planar distance between the second opening OP2 and the first, second, and third emission regions 232a, 232b, and 232c may be determined such that the light transmitted through the upper semiconductor layer 220 is emitted through the second opening OP2, thereby improving the light extraction efficiency.

Figure 5:
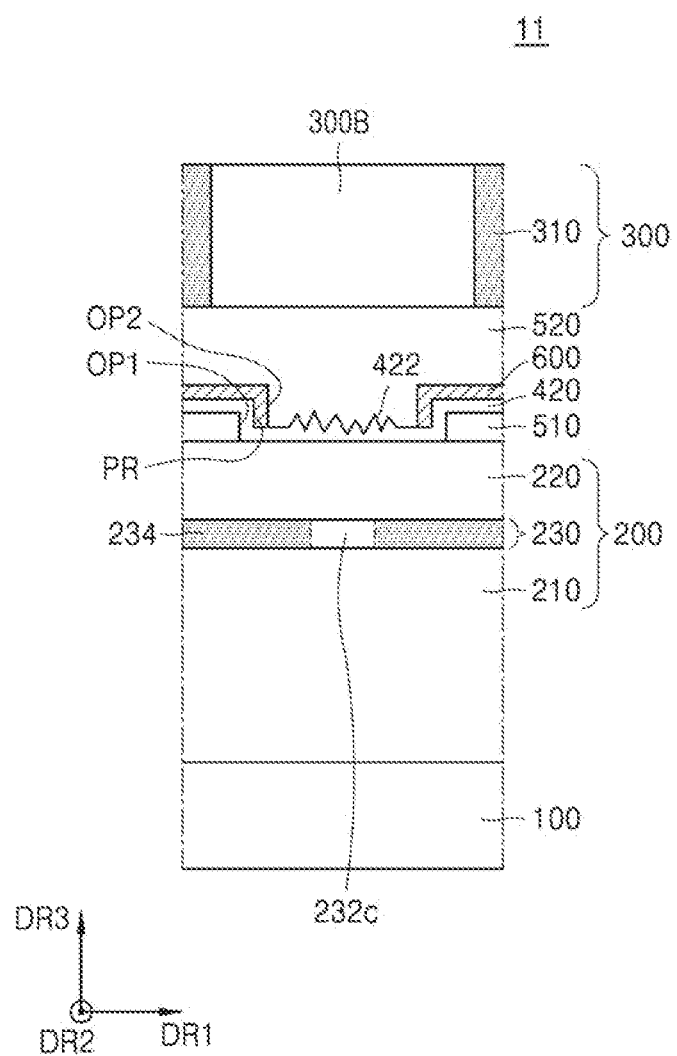
FIG. 5 is a cross-sectional view of a sub-pixel according to an example embodiment.

FIG. 5 is a cross-sectional view of a sub-pixel according to example embodiments. For brevity of description, the substantially same description provided with reference to FIGS. 1 to 3 may not be provided. Although FIG. 5 shows only a cross-sectional view illustrating a structure of a sub-pixel SB, the structures of sub-pixels SG and SR may be similar in nature to the sub-pixel SB.

Referring to FIG. 5, a display device 11 including the substrate 100, the emission layer 200, the color conversion layer 300, a lower insulating layer 510, the upper electrode layer 420, the reflective layer 600, and the upper insulating layer 520 may be provided. Unlike that described with reference to FIGS. 1 to 3, the upper electrode layer 420 may include first light extraction patterns 422. For example, the first light extraction patterns 422 may improve the light extraction efficiency of extracting light in the upper electrode layer 420 to the outside of the upper electrode layer 420. The first light extraction patterns 422 may protrude from an upper surface of the upper electrode layer 420. For example, the first light extraction patterns 422 may have a cone shape, a columnar shape, or a combination thereof. The first light extraction patterns 422 may be provided in the second opening OP2.

The first light extraction patterns 422 may form a single structure with the upper electrode layer 420. In other words, there may not be an interface between the first light extraction patterns 422 and the upper electrode layer 420. The first light extraction patterns 422 may include substantially the same material as the upper electrode layer 420. For example, the first light extraction patterns 422 may include indium tin oxide (ITO), ZnO, indium zinc oxide (IZO), indium gallium zinc oxide (IGZO), Ag, Au, and combinations thereof.

Certain example embodiments of the disclosure may provide the display device 11 with improved light extraction efficiency by the first light extraction pattern 422.

Figure 6:
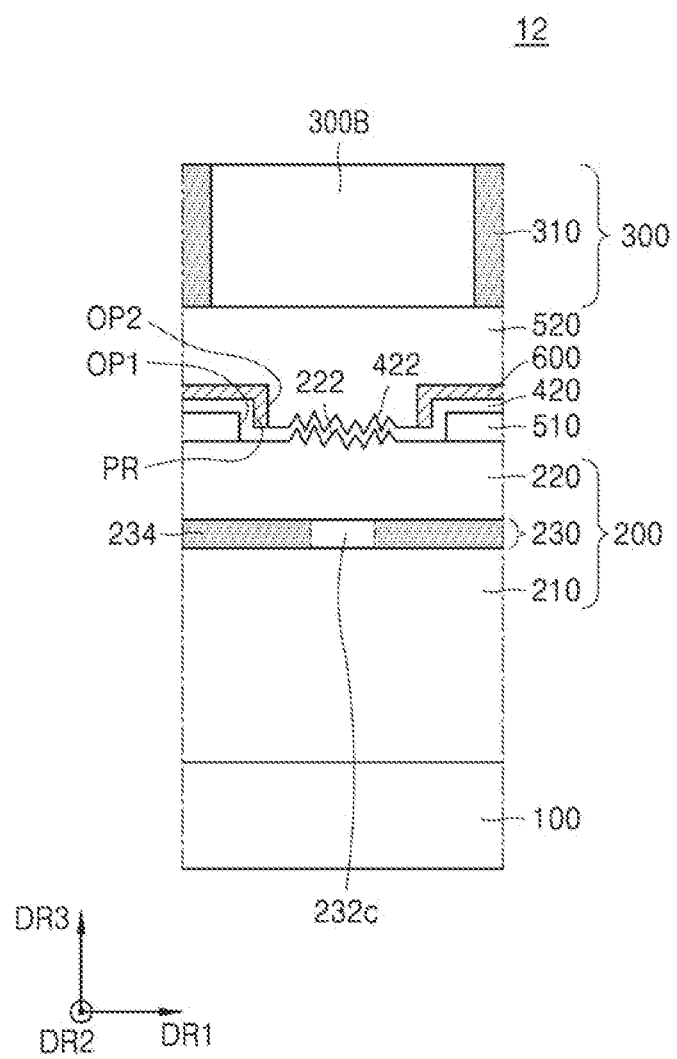
FIG. 6 is a cross-sectional view of a sub-pixel according to an example embodiment.

FIG. 6 is a cross-sectional view of a sub-pixel according to example embodiments. For brevity of description, the substantially same description provided with reference to FIG. 5 may not be provided. Although FIG. 6 shows only a cross-sectional view illustrating a structure of a sub-pixel SB, the structures of sub-pixels SG and SR may be similar in nature to the sub-pixel SB.

Referring to FIG. 6, a display device 12 including the substrate 100, the emission layer 200, the color conversion layer 300, the lower insulating layer 510, the upper electrode layer 420, the reflective layer 600, and the upper insulating layer 520 may be provided. Unlike that described with reference to FIG. 5, the upper semiconductor layer 220 may include second light extraction patterns 222. For example, the second light extraction patterns 222 may improve the light extraction efficiency of extracting light in the upper semiconductor layer 220 to the outside of the upper semiconductor layer 220. The second light extraction patterns 222 may protrude from an upper surface of the upper semiconductor layer 220. For example, the second light extraction patterns 222 may have a cone shape, a columnar shape, or a combination thereof. The second light extraction patterns 222 may be provided in the first opening OP1.

The second light extraction patterns 222 may form a single structure with the upper semiconductor layer 220. In other words, there may not be an interface between the second light extraction patterns 222 and the upper semiconductor layer 220. The second light extraction patterns 222 may include substantially the same material as the upper semiconductor layer 220. For example, the second light extraction patterns 222 may include GaN.

The upper electrode layer 420 may extend along a surface of the second light extraction patterns 222. The upper electrode layer 420 may conformally cover the second light extraction patterns 222. Accordingly, the first light extraction patterns 422 may be provided on the second light extraction patterns 222.

Certain example embodiments of the disclosure may provide the display device 12 with improved light extraction efficiency by the first and second light extraction patterns 422 and 222.

Figure 7:
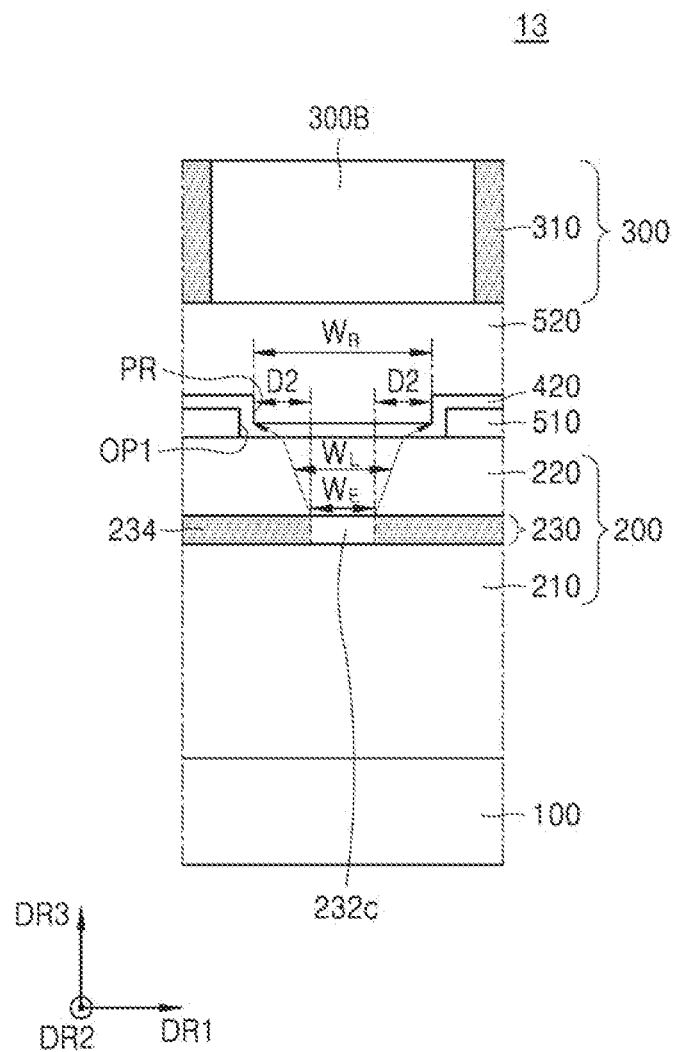
FIG. 7 is a cross-sectional view of a sub-pixel according to an example embodiment.

FIG. 7 is a cross-sectional view of a sub-pixel according to example embodiments. For brevity of description, the substantially same description provided with reference to FIGS. 1 to 4 may not be provided. Although FIG. 7 shows only a cross-sectional view illustrating a structure of a sub-pixel SB, the structures of sub-pixels SG and SR may be similar in nature to the sub-pixel SB.

Referring to FIG. 7, a display device 13 including the substrate 100, the emission layer 200, the color conversion layer 300, the lower insulating layer 510, the upper electrode layer 420, and the upper insulating layer 520 may be provided.

Unlike that described with reference to FIGS. 1 to 3, the display device 13 may not include the reflective layer 500. The upper insulating layer 520 may extend into the recess region PR in the upper electrode layer 420 to fill the recess region PR. The upper insulating layer 520 may be in direct contact with the upper electrode layer 420.

A width $W_R$ of the recess region PR may be determined such that light transmitted through the upper semiconductor layer 220 totally reaches the recess region PR without being totally reflected. The width $W_R$ of the recess region PR may be equal to or greater than, as described with reference to FIG. 4, the width $W_L$ of light when the light transmitted through the interface between the upper semiconductor layer 220 and the upper electrode layer 420 at the maximum transmission incidence angle θM (FIG. 4) reaches the recess region PR. Thus, the light extraction efficiency may be improved.

When viewed in a plan view, the first, second, and third emission regions 232a, 232b, and 232c may be spaced by a second distance D2 from the side of the recess region PR. The second distance D2 may be derived from the same equation as the first distance D1 (FIG. 4) described with reference to FIG. 4.

$$D2=(D_{MQW} \times \tan(\theta 1)+T_{ITO} \times \tan(\theta 2))$$

($D_{MQW}$: a distance between the first, second, and third emission regions 232a, 232b and 232c and an upper surface of the upper semiconductor layer 220 and $T_{ITO}$: a thickness of the upper electrode layer 420)

The second distance D2 may satisfy the following equation with the maximum transmission incidence angle θM1 and the maximum transmission refraction angle θM2 described with reference to FIG. 4.

$$D2 \geq (D_{MQW} \times \tan(\delta \theta M1)+T_{ITO} \times \tan(\theta M2))$$

Accordingly, the light transmitted through the upper semiconductor layer 220 may be completely emitted through the recess region PR.

Certain example embodiments of the disclosure may determine a size of the recess region PR and a planar distance between the recess region PR and the first, second, and third emission regions 232a, 232b and 232c such that the light transmitted through the upper semiconductor layer 220 is emitted through the recess region PR, thereby improving the light extraction efficiency.

Figure 8:
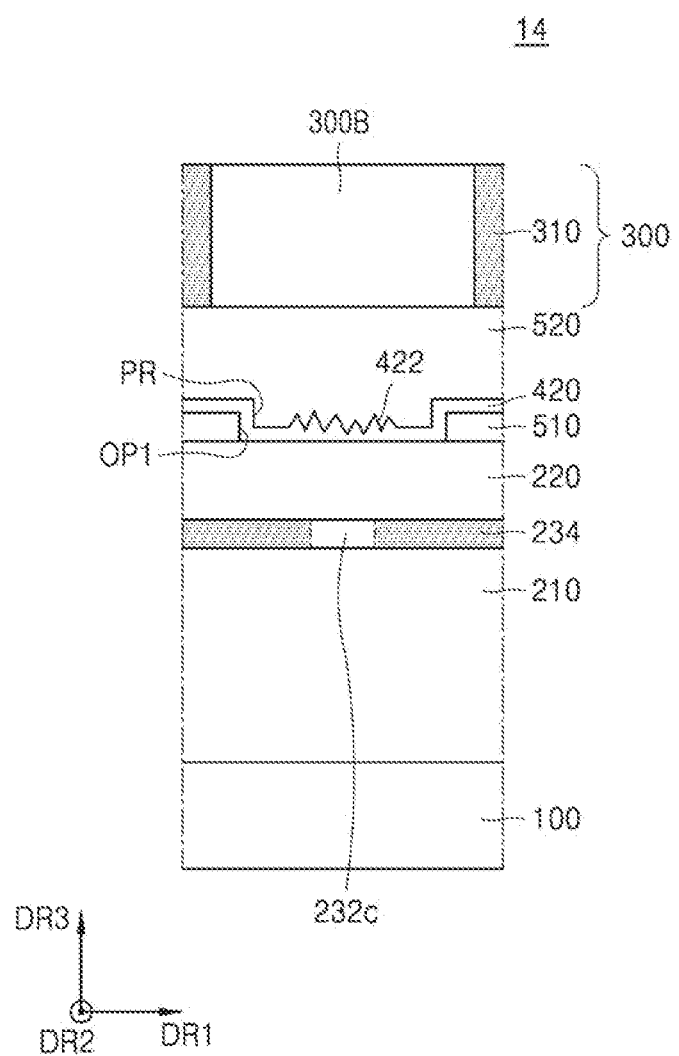
FIG. 8 is a cross-sectional view of a sub-pixel according to an example embodiment.

FIG. 8 is a cross-sectional view of a sub-pixel according to example embodiments. For brevity of description, the substantially same description provided with reference to FIG. 7 may not be provided. Although FIG. 8 shows only a cross-sectional view illustrating a structure of a sub-pixel SB, the structures of sub-pixels SG and SR may be similar in nature to the sub-pixel SB.

Referring to FIG. 8, a display device 14 including the substrate 100, the emission layer 200, the color conversion layer 300, the lower insulating layer 510, an upper electrode layer 420, and the upper insulating layer 520 may be provided. Unlike that described with reference to FIG. 7, the upper electrode layer 420 may include the first light extraction patterns 422. In this case, the first light extraction patterns 422 may improve the light extraction efficiency of extracting light in the upper electrode layer 420 to the outside of the upper electrode layer 420. The first light extraction patterns 422 may protrude from an upper surface of the upper electrode layer 420. For example, the first light extraction patterns 422 may have a cone shape, a columnar shape, or a combination thereof. The first light extraction patterns 422 may be provided in the recess region PR.

The first light extraction patterns 422 may form a single structure with the upper electrode layer 420. In other words, there may not be an interface between the first light extraction patterns 422 and the upper electrode layer 420. The first light extraction patterns 422 may include substantially the same material as the upper electrode layer 420. For example, the first light extraction patterns 422 may include indium tin oxide (ITO), ZnO, indium zinc oxide (IZO), indium gallium zinc oxide (IGZO), Ag, Au, and combinations thereof.

Certain example embodiments of the disclosure may provide the display device 14 with improved light extraction efficiency by the first light extraction patterns 422.

Figure 9:
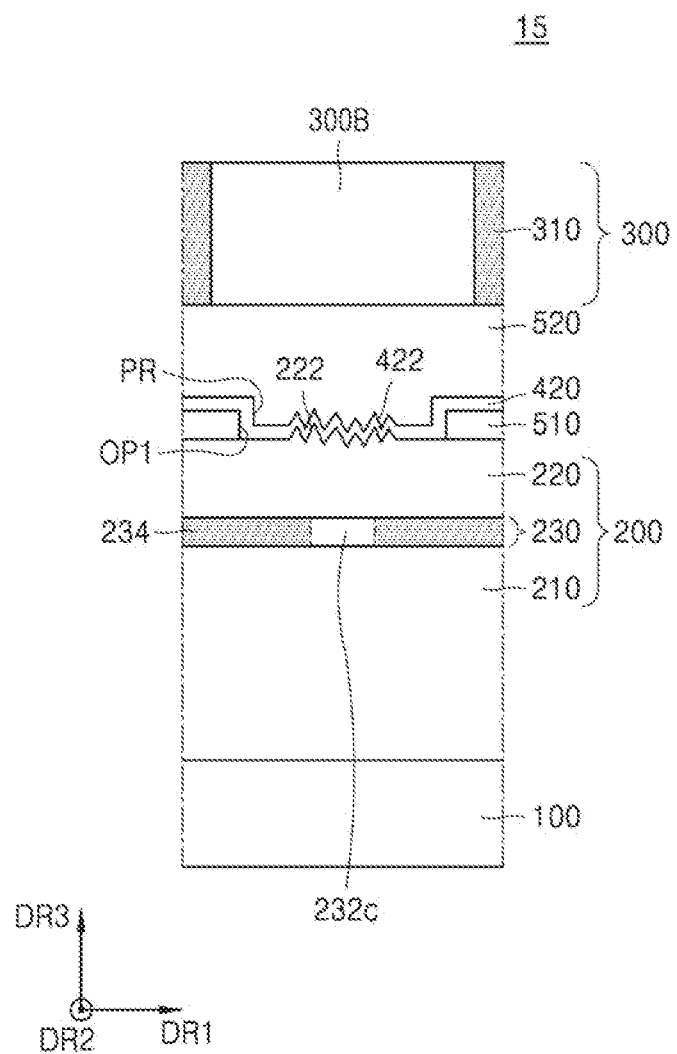
FIG. 9 is a cross-sectional view of a sub-pixel according to an example embodiment.

FIG. 9 is a cross-sectional view of a sub-pixel according to example embodiments. For brevity of description, the substantially same description provided with reference to FIG. 8 may not be provided. Although FIG. 9 shows only a cross-sectional view illustrating a structure of a sub-pixel SB, the structures of sub-pixels SG and SR may be similar in nature to the sub-pixel SB.

Referring to FIG. 9, a display device 15 including the substrate 100, the emission layer 200, the color conversion layer 300, the lower insulating layer 510, the upper electrode layer 420, the reflective layer 600, and the upper insulating layer 520 may be provided. Unlike that described with reference to FIG. 8, the upper semiconductor layer 220 may include the second light extraction patterns 222. For example, the second light extraction patterns 222 may improve the light extraction efficiency of extracting light in the upper semiconductor layer 220 to the outside of the upper semiconductor layer 220. The second light extraction patterns 222 may protrude from an upper surface of the upper semiconductor layer 220. For example, the second light extraction patterns 222 may have a cone shape, a columnar shape, or a combination thereof. The second light extraction patterns 222 may be provided in the first opening OP1.

The second light extraction patterns 222 may form a single structure with the upper semiconductor layer 220. In other words, there may not be an interface between the second light extraction patterns 222 and the upper semiconductor layer 220. The second light extraction patterns 222 may include substantially the same material as the upper semiconductor layer 220. For example, the second light extraction patterns 222 may include GaN.

The upper electrode layer 420 may extend along a surface of the second light extraction patterns 222. The upper electrode layer 420 may conformally cover the second light extraction patterns 222. Accordingly, the first light extraction patterns 422 may be provided on the second light extraction patterns 222.

Certain example embodiments of the disclosure may provide the display device 15 with improved light extraction efficiency by the first and second light extraction patterns 422 and 222.

Figure 10:
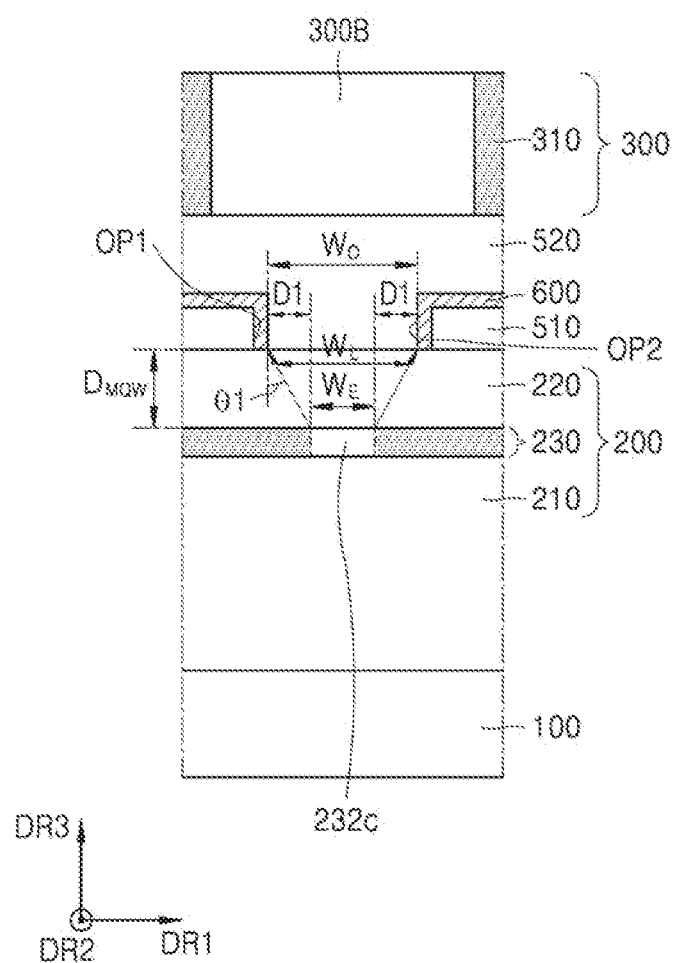
FIG. 10 is a cross-sectional view of a sub-pixel according to an example embodiment.

FIG. 10 is a cross-sectional view of a sub-pixel according to example embodiments. For brevity of description, the substantially same description provided with reference to FIGS. 1 to 4 may not be provided. Although FIG. 10 shows only a cross-sectional view illustrating a structure of a sub-pixel SB, the structures of sub-pixels SG and SR may be similar in nature to the sub-pixel SB.

Referring to FIG. 10, a display device 16 including the substrate 100, the emission layer 200, the color conversion layer 300, the lower insulating layer 510, the reflective layer 600, and the upper insulating layer 520 may be provided. Unlike that described with reference to FIGS. 1 to 3, the display device 16 may not include the upper electrode layer 420.

The reflective layer 600 may be provided on the lower insulating layer 510 to be in direct contact with the lower insulating layer 510. The reflective layer 600 may cover a surface of the lower insulating layer 510. The reflective layer 600 may extend from an upper surface of the lower insulating layer 510 into the first opening OP1 and be in direct contact with the upper surface of the upper semiconductor layer 220. The reflective layer 600 may be electrically connected to the upper semiconductor layer 220. The reflective layer 600 may apply a voltage to the upper semiconductor layer 220 instead of the upper electrode layer (420 of FIGS. 2 and 3) of FIGS. 2 and 3.

The second opening OP2 may expose the upper semiconductor layer 220. The width $W_O$ of the second opening OP2 may be determined such that light reaching an interface between the upper semiconductor layer 220 and the upper insulating layer 520 is entirely emitted through the second opening OP2. A refractive index of the upper insulating layer 520 may be less than a refractive index of the upper semiconductor layer 220.

The light emitted from the first, second, and third emission regions 232a, 232b and 232c may be incident on the upper surface of the upper semiconductor layer 220 at the first angle θ1. The first angle θ1 may be referred to as an incidence angle. In this case, the first angle θ1 may be an angle formed by the third direction DR3 and the light.

The lower insulating layer 510 may have a refractive index that is less than that of the upper semiconductor layer 220. Accordingly, when light is incident on the interface between the upper semiconductor layer 220 and the lower insulating layer 510 at an angle greater than the threshold angle θC, the light may be totally reflected. That is, when the first angle θ1 is greater than the threshold angle θC (θ1>θC), the light may not transmit through the upper semiconductor layer 220.

When the light is incident on the interface between the upper semiconductor layer 220 and the lower insulating layer 510 at an angle less than the threshold angle θC (θ1<θC), the light may transmit through the upper semiconductor layer 220. The maximum incident angle that may be transmitted through the upper semiconductor layer 220 may be referred to as the maximum transmission incidence angle θM1.

The width $W_O$ of the second opening OP2 may be determined such that light transmitted through the upper surface of the upper semiconductor layer 220 is emitted through the second opening OP2 at the maximum transmission incidence angle θM1. That is, the width $W_O$ of the second opening OP2 may be equal to or greater than the width $W_L$ of the light when the light reaches the second opening OP2 at the maximum transmission incidence angle θM1.

when viewed in a plan view, the first, second, and third emission regions 232a, 232b, and 232c may be spaced by the first distance D1 from the side of the second opening OP2. The first distance D1 may be determined by the following equation.

$$D1 = (D_{MQW} \times \tan(\theta_1))$$

(DMQW: a distance between the first, second, and third emission regions 232a, 232b and 232c and the upper surface of the upper semiconductor layer 220)

The first distance D1 may satisfy the following equation with the maximum transmission incidence angle θM1.

$$D1 \geq (D_{MQW} \times \tan(\theta M1))$$

Accordingly, the light transmitted through the upper semiconductor layer 220 may be totally emitted through the second opening OP2.

The upper insulating layer 520 may extend from the reflective layer 600 into the second opening OP2. The upper insulating layer 520 may be in direct contact with the upper semiconductor layer 220.

Certain example embodiments of the disclosure may determine a size of the second opening OP2 and a planar distance between the second opening OP2 and the first, second, and third emission regions 232a, 232b, and 232c such that the light transmitted through the upper semiconductor layer 220 is emitted through the second opening OP2, thereby improving the light extraction efficiency.

Figure 11:
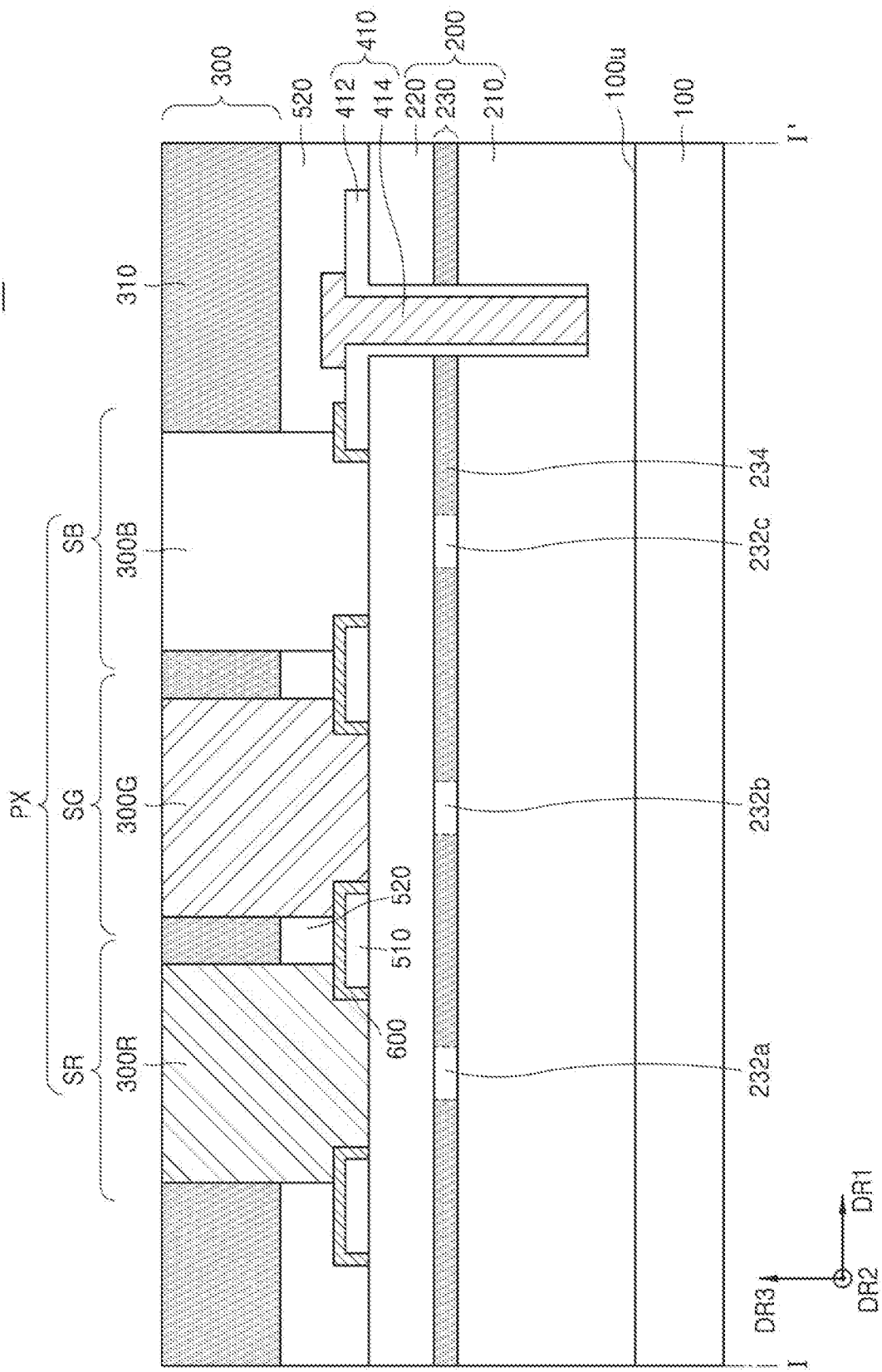
FIG. 11 is a cross-sectional view corresponding to a line I-I' of FIG. 1 according to an example embodiment.
Figure 12:
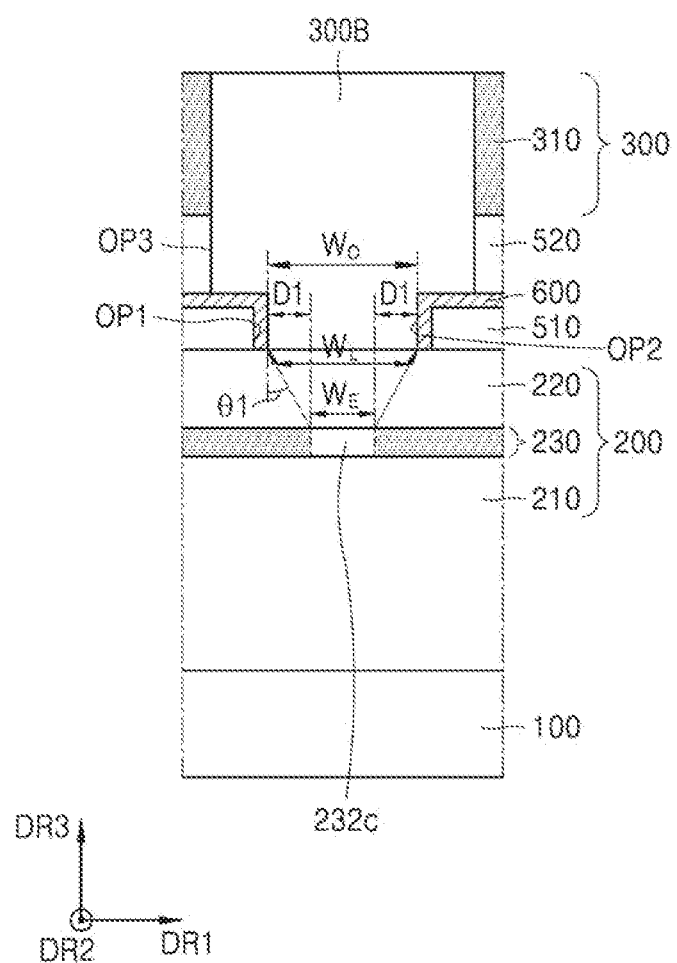
FIG. 12 is a cross-sectional view of a sub-pixel of FIG. 11 according to an example embodiment.

FIG. 11 is a cross-sectional view corresponding to a line I-I' of FIG. 1 according to certain example embodiments. FIG. 12 is a cross-sectional view of a sub-pixel of FIG. 11. For brevity of description, the substantially same description provided with reference to FIG. 10 may not be provided. Although FIG. 12 shows only a cross-sectional view illustrating a structure of a sub-pixel SB, the structures of sub-pixels SG and SR may be similar in nature to the sub-pixel SB.

Referring to FIGS. 11 and 12, a display device 17 including the substrate 100, the emission layer 200, and the color conversion layer 300 may be provided. The first, second, and third color conversion patterns 300R, 300G, and 300B may be provided in the second opening OP2 through the upper insulating layer 520, unlike that described with reference to FIG. 10. According to an example embodiment, an upper insulating layer 520 provided on the reflective layer 600 may have a third opening OP3 and the color conversion pattern 300B may be provided on the upper insulating layer 520, in the third opening OP3 and extending into the first opening OP1.

When viewed in a plan view, the first, second, and third emission regions 232a, 232b, and 232c may be spaced by the first distance D1 from a side of the second opening OP2. The first distance D1 may be substantially the same as that described with reference to FIG. 10. Therefore, the first distance D1 may satisfy the following equation with the maximum transmission incidence angle θM1.

$$D1 \geq (D_{MQW} \times \tan(\theta M1))$$

Accordingly, light transmitted through the upper semiconductor layer 220 may be totally emitted through the second opening OP2.

The upper insulating layer 520 may be provided between the first, second, and third color conversion patterns 300R, 300G, and 300B. The upper insulating layer 520 and the barrier ribs 310 may be stacked in order.

Certain example embodiments of the disclosure may determine a size of the second opening OP2 and a planar distance between the second opening OP2 and the first, second, and third emission regions 232a, 232b and 232c such that the light transmitted through the upper semiconductor layer 220 is emitted through the second opening OP2, thereby improving the light extraction efficiency.

Certain example embodiments of the disclosure may provide a display device having improved light efficiency.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A display device comprising:
   a substrate;
   an emission layer provided on the substrate, the emission layer comprising an emission region that emits light;
   an upper electrode layer provided on the emission layer; and
   a reflective layer provided on the upper electrode layer, the reflective layer comprising a first opening,
   wherein the emission region overlaps the first opening in a first direction perpendicular to an upper surface of the substrate,
   wherein a first width of the emission region is smaller than a second width of the first opening,
   wherein a dimension of the second width of the first opening is proportional to the first width of the emission region and a maximum transmission incidence angle, the maximum transmission incidence angle is a maximum angle at which the light transmits through the emission layer and is smaller than a threshold angle at which the light is totally reflected from an interface between the upper electrode layer and the emission layer,
   wherein the upper electrode layer is provided directly on the emission layer,
   wherein the reflective layer is provided directly on the upper electrode layer,
   wherein at least a portion of the upper electrode layer is directly sandwiched between the emission layer and the reflective layer, and the reflective layer overlaps both the upper electrode layer and the emission layer at a first location in the first direction, and
   wherein a bottom surface of the upper electrode layer contacts an upper surface of the emission layer, and an upper surface of the upper electrode layer contacts a bottom surface of the reflective layer.

2. The display device of claim 1, further comprising a lower insulating layer provided between the emission layer and the reflective layer, the lower insulating layer having a second opening overlapping the first opening in the first direction, and wherein the reflective layer extends along a surface of the lower insulating layer and is provided at least in a portion of the second opening.

3. The display device of claim 2, wherein the second width of the first opening is configured to emit through the first opening the light reaching the upper surface of the emission layer at the maximum transmission incidence angle.

4. The display device of claim 3, wherein the emission layer further comprises an upper semiconductor layer provided between the emission region and the lower insulating layer, and wherein, in a plan view, a distance between the reflective layer and the emission region is greater than or equal to a product of a thickness of the upper semiconductor layer and a result of a tan function of the maximum transmission incidence angle.

5. The display device of claim 1, wherein the first opening exposes the emission layer in a plan view, and wherein the reflective layer is in direct contact with the emission layer.

6. The display device of claim 5, further comprising an upper insulating layer provided on the reflective layer, wherein the upper insulating layer extends into the first opening and is in direct contact with the emission layer.

7. The display device of claim 5, further comprising:

an upper insulating layer provided on the reflective layer and having a third opening; and a color conversion pattern provided on the upper insulating layer, in the third opening and extending into the first opening.

8. The display device of claim 2, wherein the upper electrode layer has a smaller refractive index than the emission layer, wherein the first opening exposes the upper electrode layer in a plan view, and wherein the second width of the first opening is configured to emit through the first opening the light reaching the upper surface of the emission layer at the maximum transmission incidence angle.

9. The display device of claim 8, wherein the emission layer further comprises an upper semiconductor layer provided between the emission region and the upper electrode layer, wherein, in a plan view, a distance between the reflective layer and the emission region greater than or equal to a sum of a first product and a second product, wherein the first product is a product of a thickness of the upper semiconductor layer and a result of a tan function of the maximum transmission incidence angle, and wherein the second product is a product of a thickness of the upper electrode layer and a result of a tan function of a refractive angle when the light transmits through the emission layer at the maximum transmission incidence angle.

10. The display device of claim 9, further comprising light extraction patterns protruding from an upper surface of the upper semiconductor layer, wherein the light extraction patterns overlap the second opening in the first direction.

11. The display device of claim 1, further comprising a lower insulating layer provided directly on the emission layer, the lower insulating layer having a second opening overlapping the first opening in the first direction, wherein the second opening is wider than the first opening.

12. The display device of claim 1, wherein the emission layer comprises:

a lower semiconductor layer;

an upper semiconductor layer stacked on the lower semiconductor layer; and an active layer provided between the lower semiconductor layer and the upper semiconductor layer, and wherein the active layer comprises:

the emission region; and an ion implantation region surrounding the emission region, when viewed in a plan view.

13. The display device of claim 12, wherein the ion implantation region is provided between the upper semiconductor layer and the lower semiconductor layer to overlap the upper semiconductor layer and the lower semiconductor layer.

14. A display device comprising:

a substrate;

an emission layer provided on the substrate; and an upper electrode layer provided on the emission layer, the upper electrode layer comprising a recess region, wherein the emission layer comprises an emission region that overlaps the recess region in a first direction perpendicular to an upper surface of the substrate and emits light, wherein a first width of the emission region is smaller than a second width of the recess region, wherein a dimension of the second width of the recess region is proportional to the first width of the emission region and a maximum transmission incidence angle, the maximum transmission incidence angle is a maximum angle at which the light transmits through the emission layer and is smaller than a threshold angle at which the light is totally reflected from an interface between the upper electrode layer and the emission layer, wherein at least a portion of the upper electrode layer is directly sandwiched between the emission layer and a reflective layer, and the reflective layer overlaps both the upper electrode layer and the emission layer at a first location in the first direction, and wherein a bottom surface of the upper electrode layer contacts an upper surface of the emission layer, and an upper surface of the upper electrode layer contacts a bottom surface of the reflective layer.

15. The display device of claim 14, wherein the second width of the recess region is configured to emit through the recess region the light reaching the upper surface of the emission layer at the maximum transmission incidence angle.

16. The display device of claim 14, further comprising a lower insulating layer provided between the emission layer and the upper electrode layer, the lower insulating layer comprising an opening overlapping the recess region in the first direction, wherein the upper electrode layer extends along a surface of the lower insulating layer and is provided in at least a portion of the opening.

17. The display device of claim 16, further comprising light extraction patterns protruding from the upper surface of the emission layer, wherein the light extraction patterns overlap the recess region in the first direction perpendicular to the upper surface of the substrate.

18. A display device comprising:
a substrate;
an emission layer provided on the substrate, the emission layer comprising a plurality of emission regions that emit light;
an upper electrode layer provided on the emission layer;
a color conversion layer provided on the emission layer; and
a reflective layer provided on the upper electrode layer, between the emission layer and the color conversion layer, the reflective layer comprising a plurality of openings,
wherein the plurality of emission regions respectively overlap the plurality of openings in a first direction perpendicular to an upper surface of the substrate,
wherein a first width of each of the plurality of emission regions is smaller than a second width of each of the plurality of openings,
wherein a dimension of the second width of each of the plurality of openings is proportional to the first width of a corresponding one of the plurality of emission regions, and a maximum transmission incidence angle, the maximum transmission incidence angle is a maximum angle at which the light transmits through the emission layer and is smaller than a threshold angle at which the light is totally reflected from an interface between the upper electrode layer and the emission layer,
wherein at least a portion of the upper electrode layer is directly sandwiched between the emission layer and the reflective layer, and the reflective layer overlaps both the upper electrode layer and the emission layer at a first location in the first direction, and
wherein a bottom surface of the upper electrode layer contacts an upper surface of the emission layer, and an upper surface of the upper electrode layer contacts a bottom surface of the reflective layer.

19. The display device of claim 18, wherein the color conversion layer comprises a plurality of color conversion patterns, and
wherein the plurality of color conversion patterns face the plurality of emission regions, respectively.

20. The display device of claim 18, wherein the plurality of emission regions are spaced from each other in a second direction parallel to the upper surface of the substrate.

* * * * *